(12) United States Patent
Sato et al.

(10) Patent No.: US 7,105,829 B2
(45) Date of Patent: Sep. 12, 2006

(54) RADIATION DETECTOR HAVING RADIATION SENSITIVE SEMICONDUCTOR

(75) Inventors: Kenji Sato, Shiga-ken (JP); Junichi Suzuki, Kyoto-fu (JP); Nobuya Nagafune, Kyoto-fu (JP); Koji Watadani, Kyoto-fu (JP); Hidetoshi Kishimoto, Osaka-fu (JP)

(73) Assignee: Shimadzu Corporation, (JP)

( * ) Notice: Subject to any disclaimer, the term of this patent is extended or adjusted under 35 U.S.C. 154(b) by 0 days.

(21) Appl. No.: 10/936,673

(22) Filed: Sep. 9, 2004

(65) Prior Publication Data
US 2005/0051731 A1    Mar. 10, 2005

(30) Foreign Application Priority Data
Sep. 10, 2003  (JP) .............................. 2003-317965

(51) Int. Cl.
   *G01T 1/24* (2006.01)
   *H01L 27/146* (2006.01)
(52) U.S. Cl. .......................... 250/370.09; 250/370.01; 250/370.08
(58) Field of Classification Search .......... 250/370.08, 250/370.09; 257/E27.146, 740
See application file for complete search history.

(56) References Cited

U.S. PATENT DOCUMENTS

| | | | | |
|---|---|---|---|---|
| 6,069,360 A | * | 5/2000 | Lund | 250/370.12 |
| 6,403,965 B1 | * | 6/2002 | Ikeda et al. | 250/370.09 |
| 6,593,577 B1 | * | 7/2003 | Izumi | 250/370.09 |
| 6,635,860 B1 | * | 10/2003 | Sato et al. | 250/370.09 |
| 6,885,005 B1 | * | 4/2005 | Sato et al. | 250/370.01 |
| 2003/0127598 A1 | * | 7/2003 | Sato et al. | 250/370.01 |

* cited by examiner

*Primary Examiner*—David Porta
*Assistant Examiner*—Frederick F Rosenberger
(74) *Attorney, Agent, or Firm*—Rader, Fishman & Grauer PLLC (57) ABSTRACT

A radiation detector of this invention has an electrically insulating buffer seat disposed on a front surface of a radiation sensitive semiconductor, in a position outside a radiation detection effective area. A common electrode for bias voltage application is formed to cover the buffer seat. A lead wire for bias voltage supply is connected to a lead wire connection area, located on the buffer seat, of the surface of the common electrode. The buffer seat reduces a shock occurring when the lead wire is connected to the common electrode. As a result, the semiconductor and an intermediate layer are protected from damage which would lead to a lowering of performance. The buffer seat is disposed outside the radiation detection effective area. Thus, the buffer seat is provided without impairing the radiation detecting function.

3 Claims, 7 Drawing Sheets

RADIATION DETECTOR HAVING RADIATION SENSITIVE SEMICONDUCTOR

BACKGROUND OF THE INVENTION (1) Field of the Invention

This invention relates to radiation detectors of the direct conversion type including a radiation sensitive semiconductor for generating electric charges upon incidence of radiation, for use in the medical, industrial, nuclear and other fields.

(2) Description of the Related Art

An indirect conversion type radiation detector first converts radiation (e.g. X rays) into light, and then converts the light into electric signals by photoelectric conversion. As distinct from the indirect conversion type, a direct conversion type radiation detector converts incident radiation (e.g. X rays) directly into electric signals by a radiation sensitive semiconductor.

Figure 1:
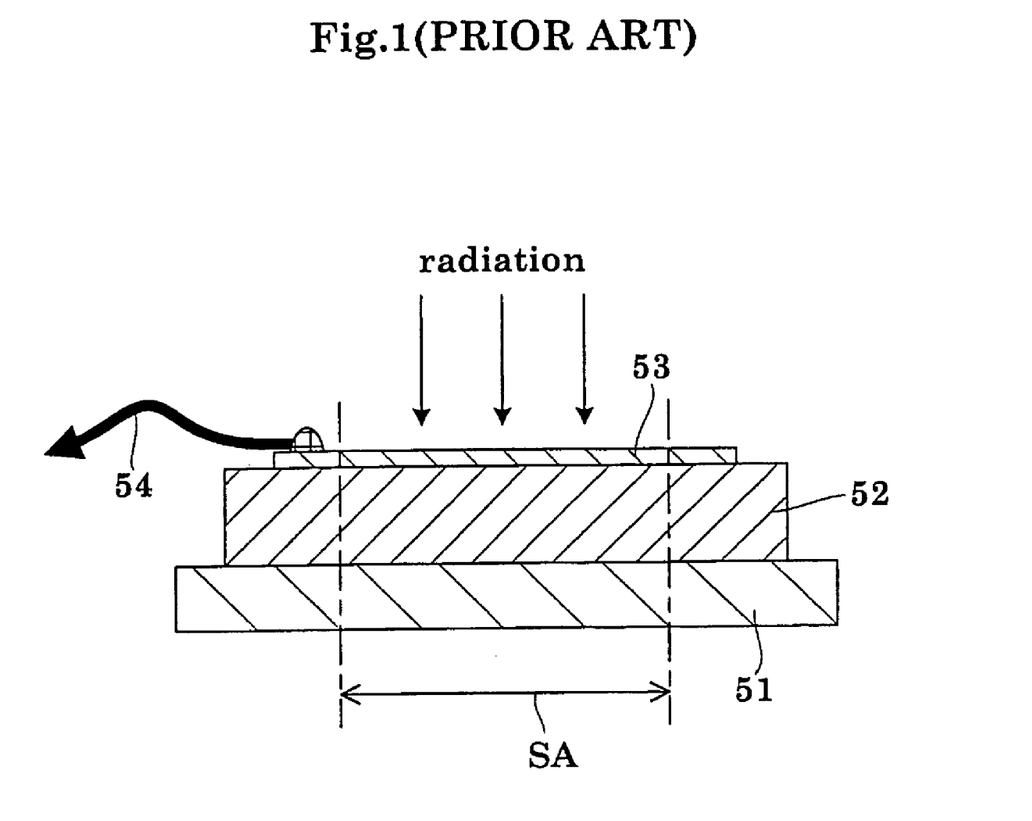
FIG. 1 is a sectional view showing an outline of a conventional radiation detector.

As shown in FIG. 1, a direct conversion type radiation detector includes an active matrix substrate 51, a radiation sensitive semiconductor 52 and a common electrode 53 for bias voltage application. A lead wire 54 for supplying a bias voltage is connected to the surface of the common electrode 53. Numerous collecting electrodes (not shown) are formed on the surface of the active matrix substrate 51, in a two-dimensional matrix arrangement set within a radiation detection effective area SA. An electric circuit (not shown) is arranged on the surface of the active matrix substrate 51 for storing and reading electric charges collected by the respective collecting electrodes upon incidence of radiation. The radiation sensitive semiconductor 52 is laid on the surface of the active matrix substrate 51 where the collecting electrodes are formed, to generate charges upon incidence of the radiation. The common electrode 53 for bias voltage application is formed two-dimensionally on the front surface of the radiation sensitive semiconductor 52.

In time of radiation detection by the direct conversion type radiation detector, a bias voltage from a bias voltage source is applied to the common electrode 53 for bias voltage application via the lead wire 54 for bias voltage supply. With the bias voltage applied, electric charges are generated by the radiation sensitive semiconductor 52 upon incidence of the radiation. The electric charges generated by the semiconductor 52 are collected by the collecting electrodes. The electric charges collected by the collecting electrodes are fetched as radiation detection signals from the respective collecting electrodes by the storage and reading electric circuit including capacitors, switching elements and electric wires.

That is, in the direct conversion type radiation detector, each of the collecting electrodes in the two-dimensional matrix arrangement acts as an electrode corresponding to each pixel in a radiographic image (pixel electrode). Radiation detection signals obtained can be used to create a radiographic image according to a two-dimensional intensity distribution of the radiation projected to the radiation detection effective area SA.

However, the conventional radiation detector has a problem that performance lowers as a result of the lead wire 54 for bias voltage supply being connected to the common electrode 53 for bias voltage application.

Since a hard metal wire such as copper wire is used for the lead wire 54 for bias voltage supply, when the lead wire 54 is connected to the common electrode 53, damage is done to the radiation sensitive semiconductor 52, leading to a lowering of performance such as a voltage resisting defect. Particularly where the semiconductor 52 is amorphous selenium or a non-selenic polycrystalline semiconductor such as CdTe, CdZnTe, $PbI_2$, $HgI_2$ or TlBr, the radiation sensitive semiconductor 52 of large area and thickness may easily be formed by vacuum deposition, but such amorphous selenium and non-selenic polycrystalline semiconductor are relatively soft and vulnerable to scratch. Even where a carrier selective intermediate layer that demonstrates a dark current reducing effect is disposed between the radiation sensitive semiconductor 52 and common electrode 53, the carrier selective intermediate layer is far thinner than the semiconductor 52, and therefore a lowering of performance such as a voltage resisting defect will occur with the carrier selective intermediate layer and semiconductor 52 when the lead wire 54 is connected to the common electrode 53.

SUMMARY OF THE INVENTION

This invention has been made having regard to the state of the art noted above, and its object is to provide a radiation detector that can avoid a lowering of performance resulting from a lead wire for bias voltage supply being connected to a common electrode for applying a bias voltage to a radiation sensitive semiconductor.

The above object is fulfilled, according to this invention, by a radiation detector having a radiation sensitive semiconductor for generating electric charges upon incidence of radiation, and a common electrode for bias voltage application formed two-dimensionally on a front surface of the radiation sensitive semiconductor, a lead wire for bias voltage supply being connected to a surface of the common electrode, the detector comprising:

an electrically insulating buffer seat disposed on the front surface of the radiation sensitive semiconductor, in a position outside a radiation detection effective area;

the common electrode for bias voltage application covering at least a portion of the buffer seat;

wherein the lead wire for bias voltage supply is connected to a surface portion of the common electrode located on the buffer seat.

When the radiation detector according to this invention detects radiation, a bias voltage is applied to the common electrode via the lead wire for bias voltage supply. With the bias voltage applied, the radiation sensitive semiconductor, upon incidence of the radiation to be detected, generates electric charges as sources of radiation detection signals.

The radiation detector of this invention includes an electrically insulating buffer seat disposed on the front surface of the radiation sensitive semiconductor, in a position outside a radiation detection effective area. The common electrode for bias voltage application covers at least a portion of the buffer seat. The lead wire for bias voltage supply is connected to a surface portion of the common electrode located on the buffer seat. The buffer seat reduces a shock occurring when the lead wire is connected to the common electrode. As a result, the radiation sensitive semiconductor is protected from damage which would lead to a voltage resisting defect.

The buffer seat for preventing damage to the radiation sensitive semiconductor is disposed outside the radiation detection effective area. Thus, the buffer seat is provided without impairing the radiation detecting function.

In one specific example according to this invention, the radiation detector further comprises an active matrix substrate, the active matrix substrate including:

a plurality of collecting electrodes formed on a surface of the active matrix substrate, in a one-dimensional or two-dimensional arrangement set within the radiation detection effective area; and an electric circuit arranged on the active matrix substrate for storing and reading electric charges collected by the respective collecting electrodes;

the radiation sensitive semiconductor being stacked on the surface, where the collecting electrodes are formed, of the active matrix substrate.

In this case, the electric charges generated in the radiation sensitive semiconductor upon incidence of the radiation are collected by the respective collecting electrodes formed on the surface of the active matrix substrate, in a one-dimensional or two-dimensional arrangement set within the radiation detection effective area. The electric charges are then outputted by the storing and reading electric circuit on the active matrix substrate as radiation detection signals for the respective collecting electrodes. That is, where the active matrix substrate is provided, this detector is a one-dimensional or two-dimensional array type radiation detector for detecting a one-dimensional or two-dimensional intensity distribution of the radiation projected to the radiation detection effective area.

In this invention, the lead wire for bias voltage supply, preferably, is connected to the common electrode by a conductive paste. The buffer seat prevents movement (migration) to the radiation sensitive semiconductor of the conductive material in the conductive paste electrically and mechanically connecting the lead wire for bias voltage supply and the common electrode. This is effective to avoid deterioration in the electrical property due to the migration of the conductive material in the conductive paste.

In one embodiment of this invention, the radiation detector further comprises a carrier selective intermediate layer formed between the radiation sensitive semiconductor and the common electrode, the buffer seat being disposed on the carrier selective intermediate layer.

In this embodiment, dark current can be reduced since an infiltration of carriers that would form dark current is prevented by the carrier selective intermediate layer formed between the radiation sensitive semiconductor and the common electrode. The buffer seat is disposed on the carrier selective intermediate layer. The buffer seat reduces a shock applied to the carrier selective intermediate layer and other films or layers formed underneath when the lead wire for bias voltage supply is connected to the common electrode. This is effective to prevent damage to the carrier selective intermediate layer and other films or layers formed underneath.

In another embodiment of this invention, the common electrode and the buffer seat are formed directly on the surface of the radiation sensitive semiconductor.

In a further embodiment of the invention, the radiation detector further comprises a plurality of collecting electrodes in a one-dimensional or two-dimensional arrangement set within the radiation detection effective area, and a carrier selective intermediate layer formed between the radiation sensitive semiconductor and the collecting electrodes.

When a positive bias voltage is applied to the common electrode, the carrier selective intermediate layer between the semiconductor and the common electrode is formed of a material having a contribution of electrons larger than a contribution of holes. This prevents an infiltration of holes from the common electrode, thereby reducing dark current.

When a negative bias voltage is applied to the common electrode, the carrier selective intermediate layer between the semiconductor and the common electrode is formed of a material having a contribution of holes larger than a contribution of electrons. This prevents an infiltration of electrons from the common electrode, thereby reducing dark current.

When a positive bias voltage is applied to the common electrode, the carrier selective intermediate layer between the semiconductor and the collecting electrodes is formed of a material having a contribution of holes larger than a contribution of electrons. This prevents an infiltration of electrons from the collecting electrodes, thereby reducing dark current.

When a negative bias voltage is applied to the common electrode, the carrier selective intermediate layer between the semiconductor and the collecting electrodes is formed of a material having a contribution of electrons larger than a contribution of holes. This prevents an infiltration of holes from the collecting electrodes, thereby reducing dark current.

The radiation sensitive semiconductor in this invention, preferably, is high purity amorphous selenium (a-Se), an amorphous semiconductor of selenium or selenium compound doped with an alkali metal such as Na, a halogen such as Cl, As or Te, or a non-selenium base polycrystalline semiconductor such as CdTe, CdZnTe, $PbI_2$, $HgI_2$ or TlBr. These materials are desirable because of their excellent aptitude for large area and large film thickness. These semiconductors usually have a Mohs hardness of 4 or less, and thus are soft and vulnerable to scratch. However, the buffer seat can reduce the shock occurring when the lead wire for bias voltage supply is connected to the common electrode, thereby protecting the semiconductor from damage. This facilitates forming the radiation sensitive semiconductor with increased area and thickness.

An appropriate thickness of the carrier selective intermediate layers is in the range of 0.1 to 10 μm. The carrier selective intermediate layers may be a polycrystalline semiconductor such as $Sb_2S_3$, ZnTe, $CeO_2$, CdS, ZnSe or ZnS, or an amorphous semiconductor of selenium or selenium compound doped with an alkali metal such as Na, a halogen such as Cl, As or Te. These materials are desirable because of their excellent aptitude for an enlarged area.

The intermediate layers having a thickness in the range of 0.1 to 10 μm can fully suppress dark current without obstructing radiation detection. A thickness of the intermediate layers less than 0.1 μm tends to be incapable of suppressing dark current sufficiently. Conversely, a thickness exceeding 10 μm tends to obstruct radiation detection, e.g. tends lower sensitivity. These semiconductors are thin and vulnerable to scratch. However, the buffer seat can reduce the shock occurring when the lead wire for bias voltage supply is connected to the common electrode, thereby protecting the intermediate layers from damage. This facilitates forming the carrier selective intermediate layers with an increased area.

The buffer seat in this invention, preferably, is formed of a hard resin material curable to a high degree of hardness, such as epoxy resin, polyurethane resin, acrylic resin or the like. The buffer seat formed of a hard resin material does not easily contract, and has an excellent buffer function, compared with one formed of a soft polymeric material of silicone resin or synthetic rubber base. Thus, the buffer seat can fully reduce the shock occurring when the lead wire for bias voltage supply is connected to the common electrode.

It is preferred in this invention that the buffer seat has a height in a range of 0.2 to 2 mm, and includes a downwardly sloped seat portion formed around a side wall thereof and having a thickness gradually decreasing outwardly away from the buffer seat, the common electrode extending from the radiation detection effective area to a top of the buffer seat, following a surface of the sloped seat portion.

The height of the buffer seat in the range of 0.2 to 2 mm will sufficiently reduce the shock applied when the lead wire for bias voltage supply is connected to the common electrode, and at the same time assures a sufficient conduction reliability of the common electrode in the portion of the buffer seat. A height of the buffer seat less than 0.2 mm would provide an insufficient thickness and render the seat easily distortable, hence a likelihood of failing to secure a sufficient buffer function. Conversely, a height exceeding 2 mm would readily cause a poor conduction due to stepping of the common electrode, thus tending to lower conduction reliability. The common electrode extends by degrees up to the top of the buffer seat, following a surface of the downwardly sloped seat portion around the side wall of the buffer seat. This construction can reliably avoid a stepping of the common electrode occurring in the region of the buffer seat.

In this invention, the radiation detector, preferably, further comprises an overcoat formed of a hard resin material to cover at least the buffer seat and the sloped seat portion. The overcoat fixes and protects the connection of the lead wire for bias voltage supply. Even when an external force is applied such as when the lead wire for bias voltage supply is detached, no force is applied to cause cracks in the common electrode on the buffer seat and sloped seat portion. Thus, a steady bias voltage may be supplied.

The sloped seat portion may be formed of the same hard resin material as the buffer seat, or may be formed of a soft polymeric material of silicone resin or synthetic rubber base.

The radiation detector, preferably, further comprises a collimator for preventing the radiation incident on the radiation detection effective area from impinging on edges of the common electrode and the buffer seat. In this case, the radiation is incident on the radiation detection effective area without impinging on the edges of the common electrode and the buffer seat. This detector can prevent contingent strong currents that would cause a failure of the detector, from being produced by the radiation impinging on the edges of the common electrode and the buffer seat where electric fields concentrate.

Preferably, the common electrode has an edge thereof extending over the buffer seat, the common electrode has, in locations other than the buffer seat, a sloped portion for electrode formed of an electrically insulating polymeric material and extending along edges of the common electrode, the sloped portion having a thickness gradually increasing outwardly of the common electrode, and the edges of the common electrode extend to and mount on the sloped portion.

In this case, the edges of the common electrode extend over the electrically insulating buffer seat and the sloped portion for the electrode formed of an electrically insulating polymeric material. This eases the electric field concentration on the edges of the common electrode, thereby reliably preventing contingent strong currents that would cause a failure of the detector, from being produced by the radiation impinging on the edges of the common electrode and the buffer seat.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

First Embodiment

Figure 2:
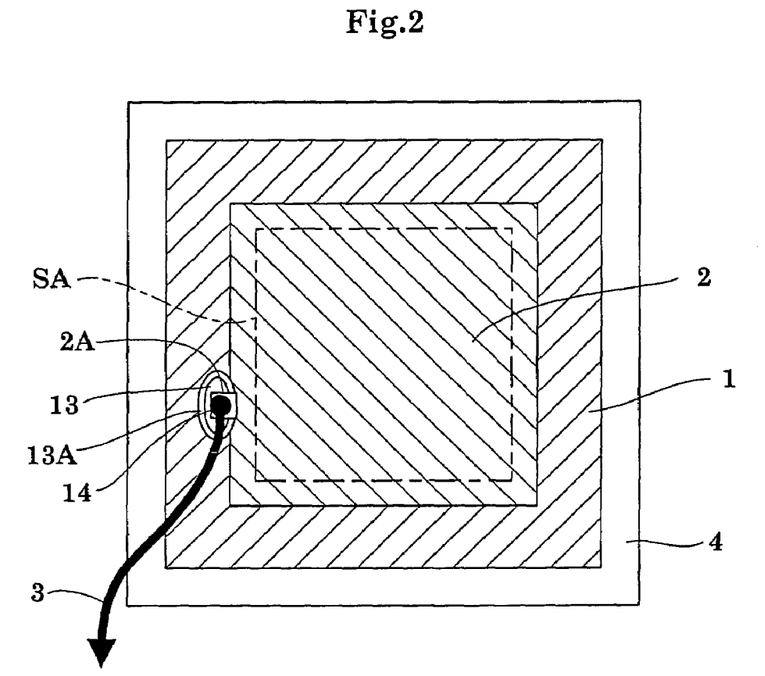
FIG. 2 is a plan view showing a principal portion of a radiation detector in a first embodiment of the invention.
Figure 3:
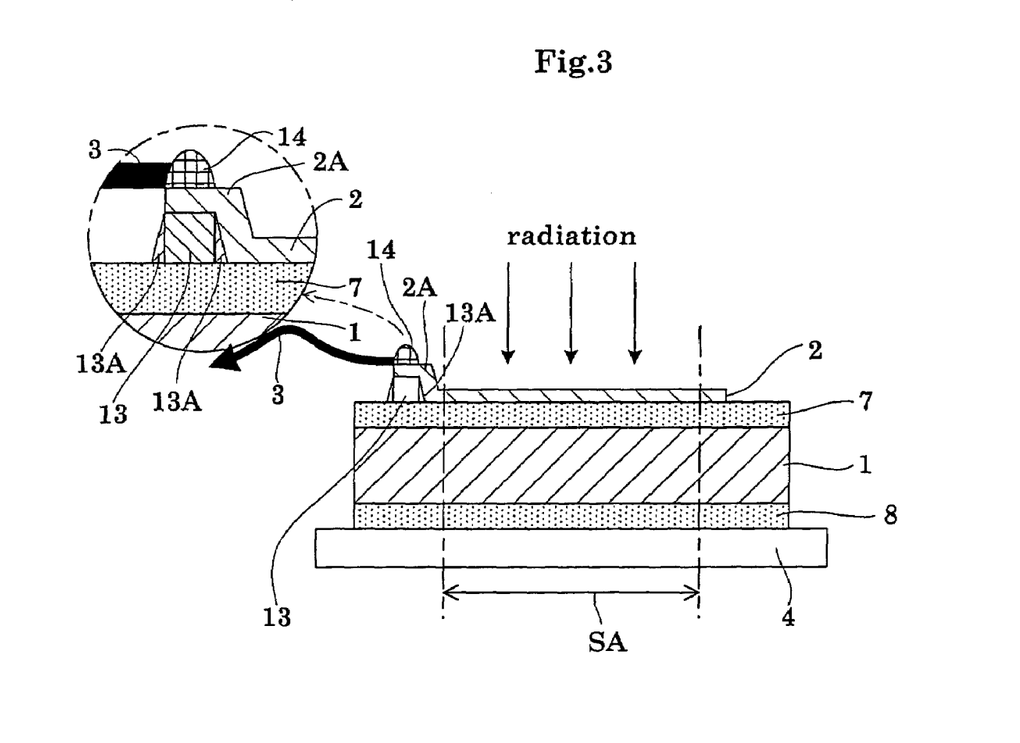
FIG. 3 is a sectional view showing the principal portion of the detector in the first embodiment.
Figure 4:
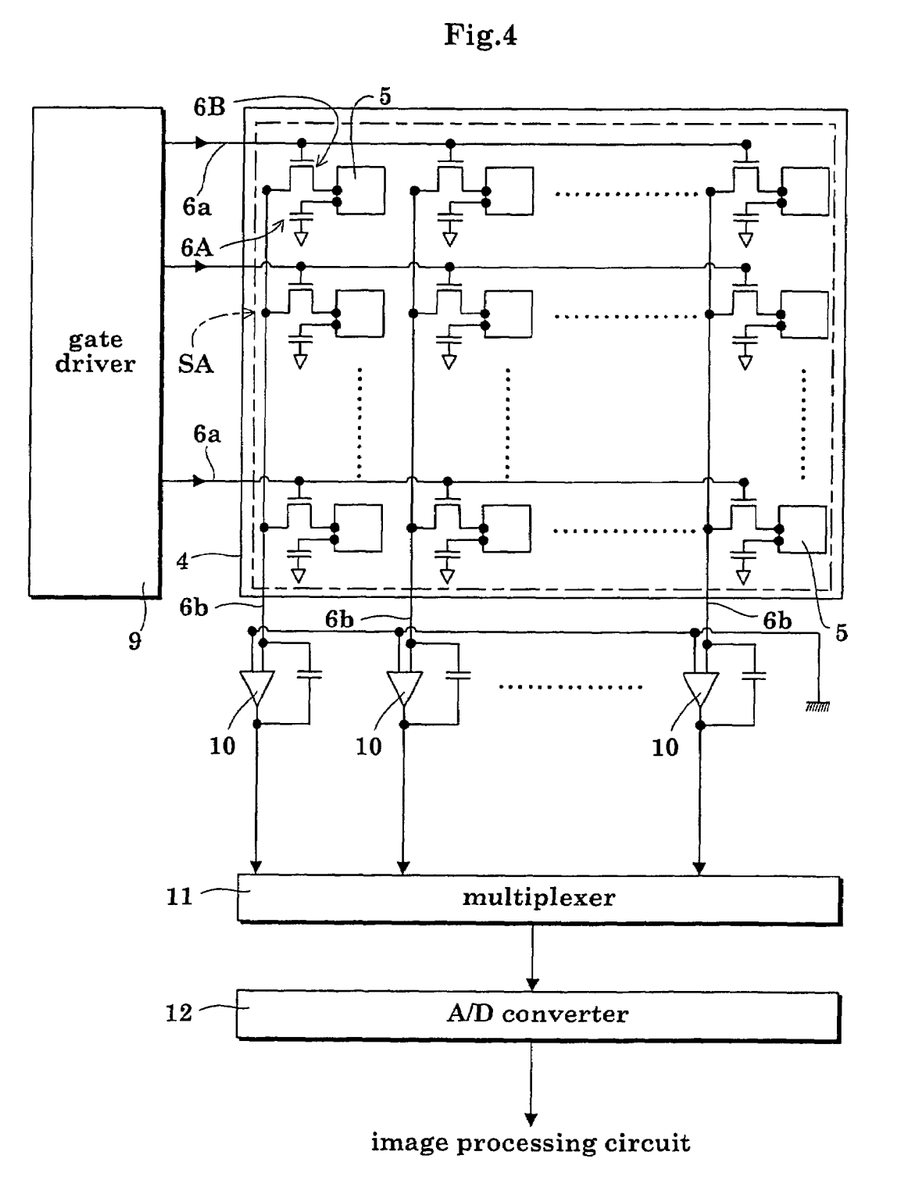
FIG. 4 is a block diagram showing electric circuits on and around an active matrix substrate of the detector in the first embodiment.
Figure 5:
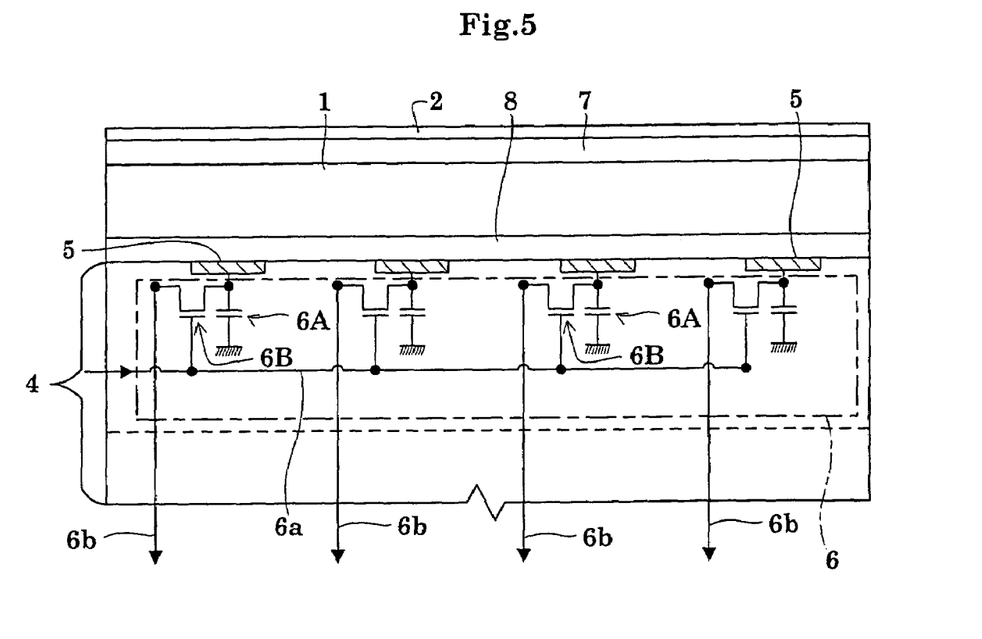
FIG. 5 is a schematic sectional view showing a construction of the active matrix substrate of the detector in the first embodiment.
Figure 6:
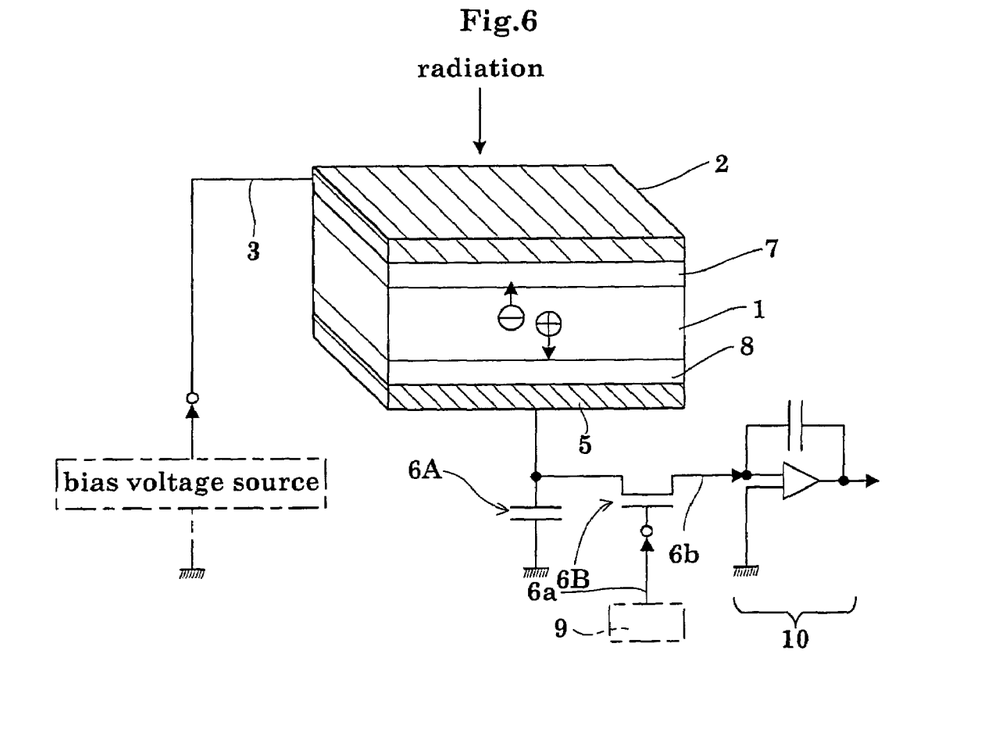
FIG. 6 is an electrical equivalent circuit diagram of one radiation detecting unit of the detector in the first embodiment.

A radiation detector embodying this invention will be described with reference to the drawings. FIG. 2 is a plan view showing a principal portion of a radiation detector in a first embodiment of the invention. FIG. 3 is a sectional view showing the principal portion of the detector in the first embodiment. FIG. 4 is a block diagram showing electric circuits on and around an active matrix substrate of the detector in the first embodiment. FIG. 5 is a schematic sectional view showing a construction of the active matrix substrate of the detector in the first embodiment. FIG. 6 is an electrical equivalent circuit diagram of one radiation detecting unit of the detector in the first embodiment.

As shown in FIGS. 2 and 3, the radiation detector in the first embodiment includes a radiation sensitive semiconductor 1 and a common electrode 2 for bias voltage application. A lead wire 3 for supplying a bias voltage is connected to the surface of the common electrode 2. The radiation sensitive semiconductor 1 generates electric charges upon incidence of radiation. The common electrode 2 for bias voltage application is formed two-dimensionally on the front surface of the radiation sensitive semiconductor 1. As shown in FIG. 4, the detector in the first embodiment includes an active matrix substrate 4. Numerous collecting electrodes 5 are formed on the surface of the active matrix substrate 4, as shown in FIG. 5, in a two-dimensional matrix arrangement set within a radiation detection effective area SA. An electric circuit 6 is arranged on the surface of the active matrix substrate 4 for storing and reading electric charges collected by the respective collecting electrodes 5. The radiation sensitive semiconductor 1 is laid on the surface of the active matrix substrate 4 where the collecting electrodes 5 are formed. A carrier selective intermediate layer 7 is formed between the radiation sensitive semiconductor 1 and common electrode 2. Another carrier selective intermediate layer 8 is formed between the radiation sensitive semiconductor 1 and collecting electrodes 5.

The storing and reading electric circuit 6 arranged on the active matrix substrate 4 includes capacitors 6A, TFTs (thin film field-effect transistors) 6B acting as switching elements, gate lines 6a and data lines 6b. One capacitor 6A and one TFT 6B are provided for each collecting electrode 5. Around the storing and reading electric circuit 6 on the active matrix substrate 4 are a gate driver 9, charge-to-voltage converting amplifiers 10, a multiplexer 11 and an analog-to-digital converter 12 connected as external devices. Some or all of the gate driver 9, charge-to-voltage converting amplifiers 10, multiplexer 11 and analog-to-digital converter 12 may be built into the active matrix substrate 4, instead of being external devices.

In time of radiation detection by the detector in the first embodiment, a bias voltage of several kilovolts to tens of kilovolts outputted from a bias voltage source is applied to the common electrode 2 via the lead wire 3. With the bias voltage applied, the radiation sensitive semiconductor 1 generates electric charges upon incidence of the radiation to be detected. The electric charges generated by the semiconductor 1 are collected by the respective collecting electrodes 5. More particularly, electric charges are induced in the collecting electrodes 5 by movement to the respective collecting electrodes 5. The electric charge collected in each collecting electrode 5 is fetched by the storing and reading electric circuit 6 on the active matrix substrate 4 as a radiation detection signal for each collecting electrode 5.

Specifically, as the gate driver 9 successively applies read signals via gate lines 6a to the gates of the respective TFTs 6B, the data lines 6b connected to the sources of the TFTs 6B receiving the read signals are successively switched and connected to the multiplexer 11. With this switching connection, the electric charges stored in the capacitors 6A are transmitted from TFTs 6B through the data lines 6b, amplified by the charge-to-voltage converting amplifiers 10, and outputted from the multiplexer 11 as radiation detection signals for the respective collecting electrodes 5 to the analog-to-digital converter 12 to be digitized therein.

Where, for example, the detector in the first embodiment is provided for a fluoroscopic apparatus, the radiation detection signals outputted from the detector are transmitted to an image processing circuit disposed at a subsequent stage to create a two-dimensional fluoroscopic image or the like.

That is, in the detector in the first embodiment, each of the collecting electrodes 5 in the two-dimensional matrix arrangement acts as an electrode corresponding to each pixel in a radiographic image (pixel electrode). This detector is a two-dimensional array type detector for providing radiation detection signals for use in creating a radiographic image according to a two-dimensional intensity distribution of the radiation projected to the radiation detection effective area SA.

The detector in the first embodiment may be regarded as a detector having a two-dimension matrix arrangement along longitudinal and transverse lattice lines in the radiation detection effective area SA of radiation detecting units (radiation detecting elements) in an equivalent circuit shown in FIG. 6.

Each component of the detector in the first embodiment will be described in greater detail hereinafter.

The detector in the first embodiment has an electrically insulating buffer seat 13 disposed on the front surface of the radiation sensitive semiconductor 1, outside the radiation detection effective area SA. The common electrode 2 for bias voltage application is formed to cover a large part of the buffer seat 13. The lead wire 3 for bias voltage supply is connected to a portion located on the buffer seat 13 of the surfaces of the common electrode 2. This is a salient characteristic of the construction. That is, the carrier selective intermediate layer 7 is provided in the first embodiment, and the buffer seat 13 is formed to have a substantially elliptical planar shape on the intermediate layer 7. On the other hand, part of the common electrode 2 continuously extends out of the radiation detection effective area SA over the buffer seat 13. A thin metal film (e.g. thin gold film) is formed on that part to define a rectangular lead wire connection area 2A as an integral part of the common electrode 2. The lead wire 3, such as a copper wire, is connected to the surface of the lead wire connection area 2A by a conductive paste (e.g. silver paste) 14. When the carrier selective intermediate layer 7 is not provided, the common electrode 2 and buffer seat 13 will be formed directly on the surface of the radiation sensitive semiconductor 1.

With the detector in the first embodiment, therefore, when the lead wire 3 for bias voltage supply is connected to the surface of the common electrode 2, the buffer seat 13 reduces the shock applied to the carrier selective intermediate layer 7 directly underneath and to the radiation sensitive semiconductor 1 under the intermediate layer 7. This is effective to prevent damage to the carrier selective intermediate layer 7 and radiation sensitive semiconductor 1. Since the buffer seat 13 which prevents damage to the carrier selective intermediate layer 7 and radiation sensitive semiconductor 1 is disposed outside the radiation detection effective area SA, the buffer seat 13 will never impair the radiation detecting function.

Thus, the detector in the first embodiment can avoid a lowering of performance resulting from the lead wire 3 for bias voltage supply being connected to the common electrode 2 for applying a bias voltage to the radiation sensitive semiconductor 1.

Further, with the detector in the first embodiment, the buffer seat 13 prevents the conductive material in the conductive paste 14 electrically and mechanically connecting the common electrode 2 and the lead wire 3 for bias voltage supply, from moving (migrating) to the radiation sensitive semiconductor 1. This is effective to avoid a deterioration of electrical characteristics caused by migration of the conductive material in the conductive paste 14.

An appropriate height of the buffer seat 13 is in the range of 0.2 to 2 mm. This range will sufficiently reduce the shock applied when the lead wire for bias voltage supply is connected to the common electrode, and at the same time assures a sufficient conduction reliability of the common electrode in the portion of the buffer seat. A height of the buffer seat 13 less than 0.2 mm would provide an insufficient thickness and render the seat 13 easily distortable, hence a likelihood of failing to secure a sufficient buffer function. Conversely, a height exceeding 2 mm would readily cause a poor conduction due to stepping of the common electrode 2, thus tending to lower conduction reliability.

In the detector in the first embodiment, as shown in FIG. 3, the buffer seat 13 includes a downwardly sloped seat portion 13A formed around the entire side wall thereof and having a thickness gradually decreasing outwardly away from the seat 13. The common electrode 2 extends from the radiation detection effective area SA to the top of the buffer seat 13, following the surface of the sloped portion 13A. Thus, the common electrode 2 is shaped to climb the buffer seat 13 gradually while extending along the surface of the downwardly sloped seat portion 13A around the side wall of the buffer seat 13. This construction can reliably avoid a stepping of the common electrode 2 occurring in the region of the buffer seat 13.

A stepping of the common electrode 2 would cause a lowering of the bias voltage due to poor conduction. Then, the same voltage applied to the lead wire connection area 2A would not be applied to the portion of the common electrode 2 in the radiation detection effective area SA. It is therefore necessary to prevent a stepping of the common electrode 2 in order to avoid a shortage of bias voltage.

The buffer seat 13, preferably, is formed of a hard resin material curable to a high degree of hardness, such as epoxy resin, polyurethane resin, acrylic resin or the like. The buffer seat 13 formed of a hard resin material does not easily contract, and has an excellent buffer function. Thus, the buffer seat 13 can fully reduce the shock occurring when the lead wire 3 for bias voltage supply is connected to the common electrode 2.

The sloped seat portion 13A may be formed of the same hard resin material as the buffer seat 13, or may be formed of a soft polymeric material of silicone resin or synthetic rubber base.

The radiation sensitive semiconductor 1, preferably, is high purity amorphous selenium (a-Se), an amorphous semiconductor of selenium or selenium compound doped with an alkali metal such as Na, a halogen such as Cl, As or Te, or a non-selenium base polycrystalline semiconductor such as CdTe, CdZnTe, $PbI_2$, $HgI_2$ or TlBr. These materials are desirable because of their excellent aptitude for large area and large film thickness. These semiconductors usually have a Mohs hardness of 4 or less, and thus are soft and vulnerable to scratch. However, the buffer seat 13 can reduce the shock occurring when the lead wire 3 for bias voltage supply is connected to the common electrode 2, thereby protecting the radiation sensitive semiconductor 1 from damage. This facilitates forming the radiation sensitive semiconductor 1 with increased area and thickness. In particular, amorphous selenium with a resistivity of $10^9 \Omega$ or greater, preferably $10^{11} \Omega$ or greater, has an outstanding aptitude for large area and large film thickness. The radiation sensitive semiconductor 1 usually has a film thickness of 0.5 to 1.5 mm and an area of 20 to 50 cm by 20 cm to 50 cm, for example.

As shown in FIG. 5, the active matrix substrate 4 has, formed on an insulating substrate such as a glass substrate, the capacitors 6A and TFTs 6B for the storing and reading electric circuit 6, and the gate lines 6a and data lines 6b in a crisscross pattern. Further, the collecting electrodes 5 are formed on the surface in a two-dimensional matrix arrangement. The carrier selective intermediate layer 8, radiation sensitive semiconductor 1, carrier selective intermediate layer 7 and common electrode 2 are laminated in the stated order on the surface of the active matrix substrate 4 having the collecting electrodes 5.

The detector in the first embodiment, with the carrier selective intermediate layers 7 and 8, can reduce dark current. The carrier selectivity here refers to a property of being remarkably different in contribution to the charge transfer action between electrons and holes which are charge transfer media (carriers) in a semiconductor.

The semiconductor 1 and carrier selective intermediate layers 7 and 8 may be combined in one of the following modes. Where a positive bias voltage is applied to the common electrode 2, the carrier selective intermediate layer 7 is formed of a material having a greater contribution of electrons than of holes. This prevents an infiltration of holes from the common electrode 2 to reduce dark current. The carrier selective intermediate layer 8 is formed of a material having a greater contribution of holes than of electrons. This prevents an infiltration of electrons from the collecting electrodes 5 to reduce dark current.

Conversely, where a negative bias voltage is applied to the common electrode 2, the carrier selective intermediate layer 7 is formed of a material having a greater contribution of holes than of electrons. This prevents an infiltration of electrons from the common electrode 2 to reduce dark current. The carrier selective intermediate layer 8 is formed of a material having a greater contribution of electrons than of holes. This prevents an infiltration of holes from the collecting electrodes 5 to reduce dark current.

It is not absolutely necessary to provide carrier selective intermediate layers for the detector according to this invention. One or both of the intermediate layers 7 and 8 may be omitted.

An appropriate thickness of the carrier selective intermediate layers 7 and 8 is in the range of 0.1 to 10 μm. A thickness of the intermediate layers 7 and 8 less than 0.1 μm tends to be incapable of suppressing dark current sufficiently. Conversely, a thickness exceeding 10 μm tends to obstruct radiation detection, e.g. tends to lower sensitivity.

A semiconductor used for the carrier selective intermediate layers 7 and 8 may be a polycrystalline semiconductor such as $Sb_2S_3$, ZnTe, $CeO_2$, CdS, ZnSe or ZnS, or an amorphous semiconductor of selenium or selenium compound doped with an alkali metal such as Na, a halogen such as Cl, As or Te. These materials are desirable because of their excellent aptitude for an enlarged area. These semiconductors are thin and vulnerable to scratch. However, the buffer seat 13 can reduce the shock occurring when the lead wire 3 for bias voltage supply is connected to the common electrode 2, thereby protecting the intermediate layers 7 and 8 from damage. This facilitates forming the carrier selective intermediate layers 7 and 8 with an enlarged area.

Among the semiconductors usable for the intermediate layers 7 and 8, those having a large contribution of electrons are n-type semiconductors including polycrystalline semiconductors such as $CeO_2$, CdS, CdSe, ZnSe and ZnS, and amorphous materials such as amorphous selenium doped with an alkali metal, As or Te to reduce the contribution of holes.

Those having a large contribution of holes are p-type semiconductors including polycrystalline semiconductors such as ZnTe, and amorphous materials such as amorphous selenium dopes with a halogen to reduce the contribution of electrons.

Further, $Sb_2S_3$, CdTe, CdZnTe, $PbI_2$, $HgI_2$, TlBr, non-doped amorphous selenium or selenium compounds include the type having a large contribution of electrons and the type having a large contribution of holes. Either type may be selected for use as long as film forming conditions are adjusted.

Figure 7:
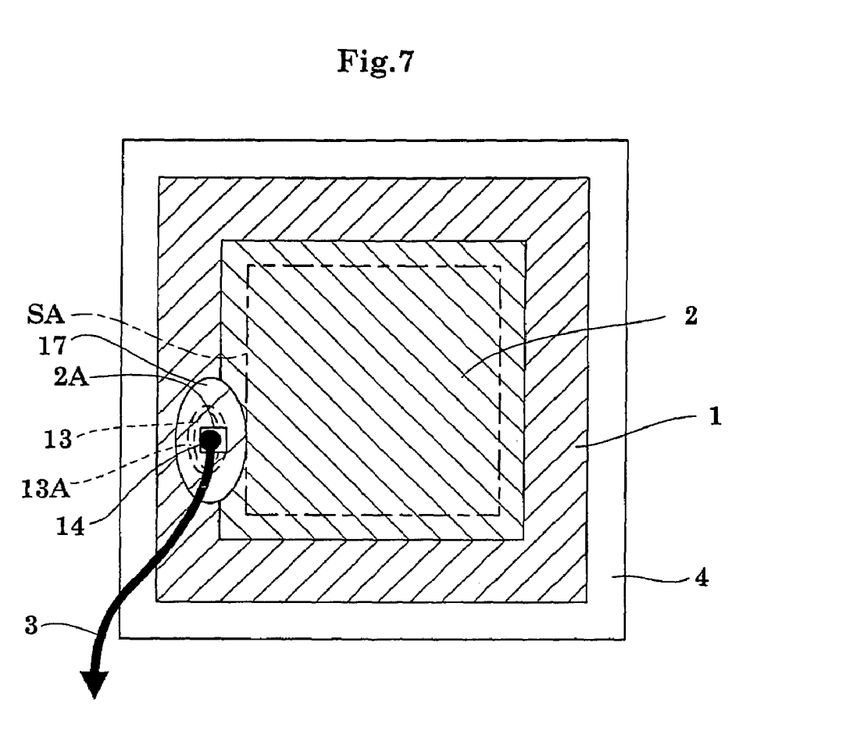
FIG. 7 is a plan view showing a principal portion of a modified detector in the first embodiment.
Figure 8:
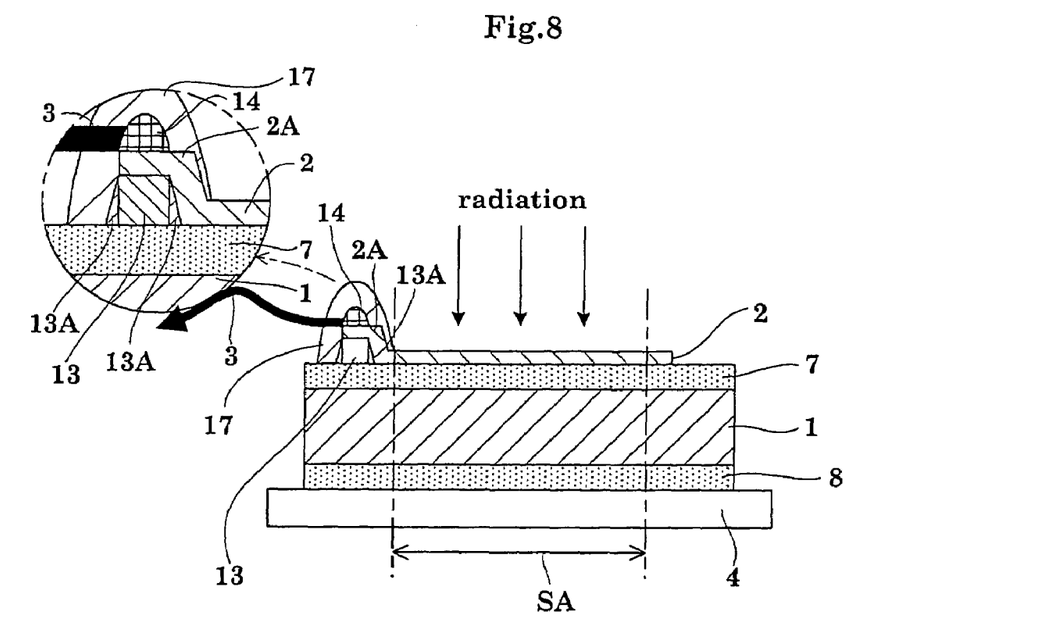
FIG. 8 is a sectional view showing the principal portion of the modified detector in the first embodiment.

A modification of the first embodiment is shown in FIGS. 7 and 8. FIG. 7 is a plan view showing a principal portion of a detector. FIG. 8 is a sectional view showing the principal portion of the detector. What is different from the construction shown in FIGS. 2 and 3 is an addition of an overcoat 17 formed of a hard resin material and covering the buffer seat 13 and sloped seat portion 13A. The other details are the same as in the first embodiment.

While, in FIGS. 7 and 8, the overcoat 17 extends to the vicinity of the radiation detection effective area SA, what is necessary is to cover at least the buffer seat 13 and sloped seat portion 13A. The hard resin material for forming the overcoat 17 may be epoxy resin, polyurethane resin, acrylic resin or the like, as noted hereinbefore in relation to the sloped seat portion 13A. That is, where the sloped seat portion 13A is formed of a hard resin material, the same material may be used for forming the overcoat 17.

In this modification, the overcoat 17 fixes and protects the connection of the lead wire 3 for bias voltage supply. Even when an external force is applied such as when the lead wire 3 for bias voltage supply is detached, no force is applied to cause cracks in the common electrode 2 on the buffer seat 13 and sloped seat portion 13A. Thus, a steady bias voltage may be supplied.

Second Embodiment

Figure 9:
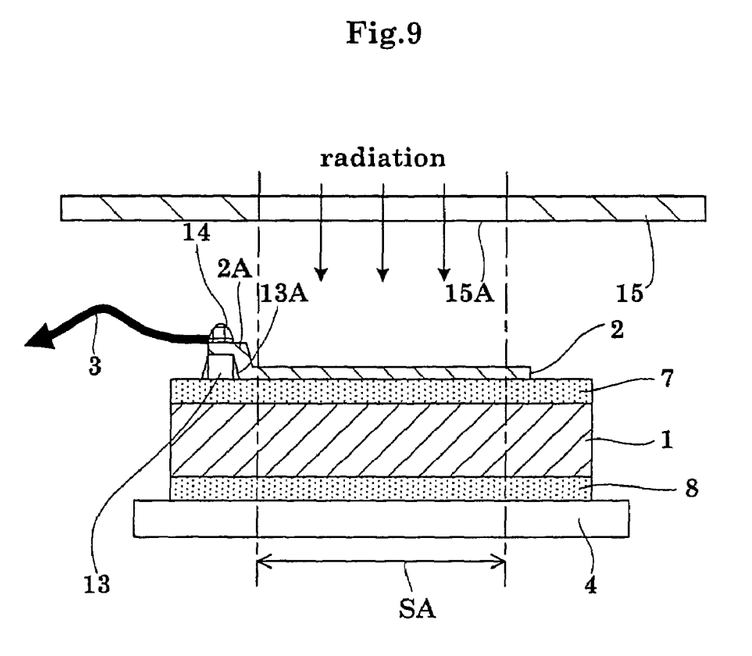
FIG. 9 is a sectional view showing a principal portion of a detector in a second embodiment.

A radiation detector in a second embodiment will be described with reference to the drawings. FIG. 9 is a sectional view showing a principal portion of the radiation detector in the second embodiment.

As shown in FIG. 9, the detector in the second embodiment includes a collimator 15 disposed at the radiation incidence side for preventing the radiation incident on the radiation detection effective area SA from impinging on edges of the common electrode 2 and the buffer seat 13. Apart from the collimator 15, this detector is the same as the detector in the first embodiment. The common features will not be described again, but only the different aspect will be described below.

With the detector in the second embodiment, electric fields formed by application of the bias voltage concentrate on the edges of the common electrode 2 and the side walls of the buffer seat 13. When the radiation impinges on the edges of the common electrode 2 and the side walls of the buffer seat 13, contingent strong currents could flow that would cause a failure of the detector (in particular, destruction of TFTs 6B of the storing and reading electric circuit 6).

Thus, in the second embodiment, the collimator 15 has an opening 15A formed so that the radiation may exactly enter the radiation detection effective area SA without impinging on the edges of the common electrode 2 and the buffer seat 13. As a result, the detector in the second embodiment prevents the radiation from impinging on the edges of the common electrode 2 and the buffer seat 13. This detector can prevent contingent strong currents that would cause a failure of the detector, from being produced by the radiation impinging on the edges of the common electrode 2 and the side walls of the buffer seat 13 where electric fields concentrate.

Third Embodiment

Figure 10:
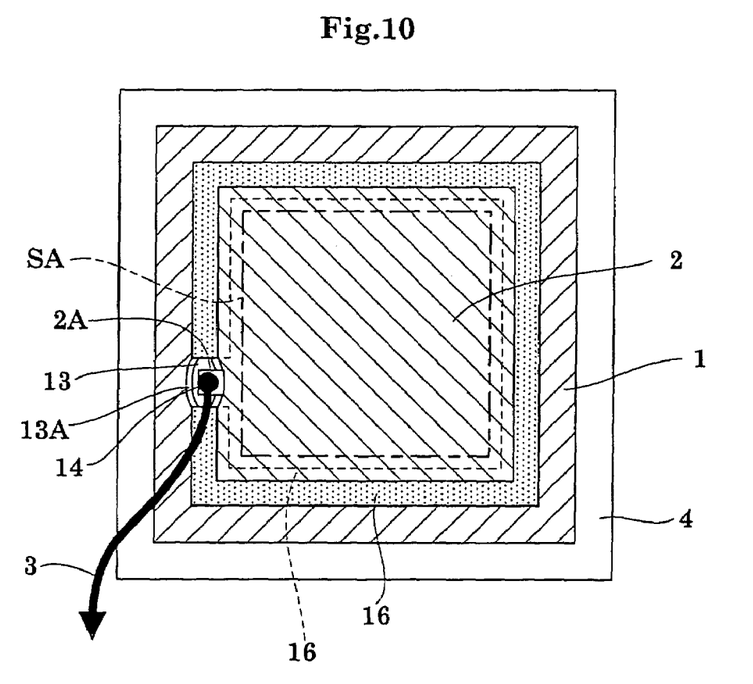
FIG. 10 is a plan view showing a principal portion of a detector in a third embodiment.
Figure 11:
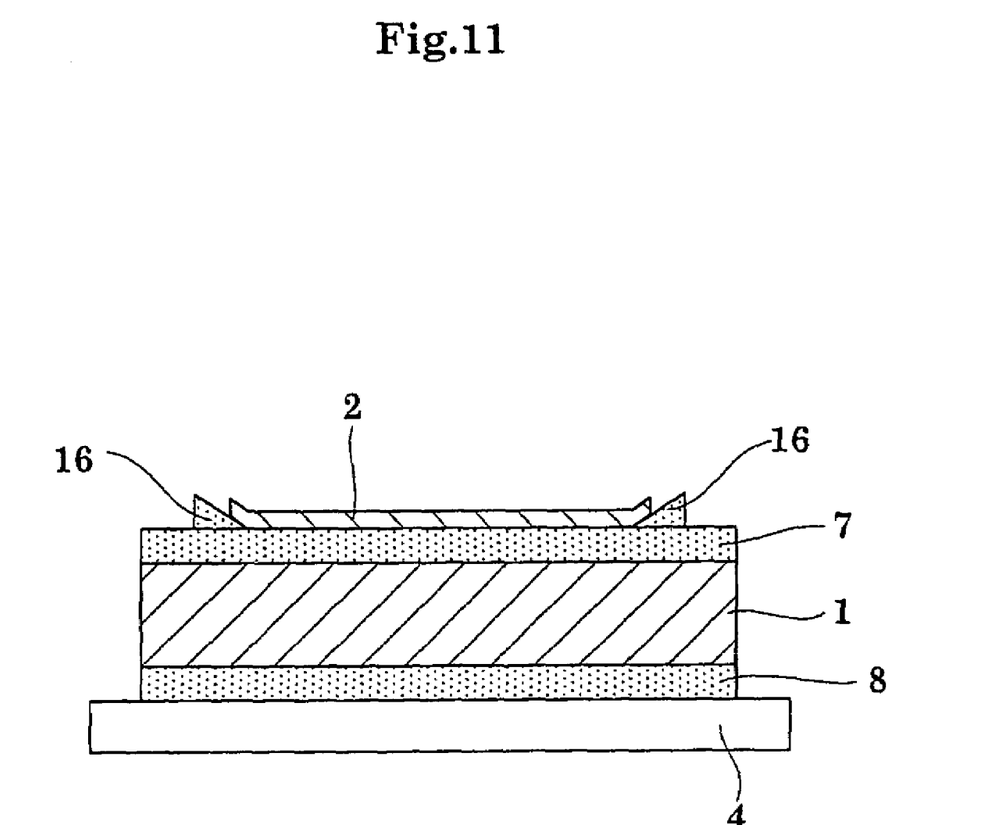
FIG. 11 is a fragmentary sectional view showing edges of a common electrode of the detector in the third embodiment.

A radiation detector in a third embodiment will be described with reference to the drawings. FIG. 10 is a plan view showing a principal portion of the detector in the third embodiment. FIG. 11 is a fragmentary sectional view showing edges of a common electrode of the detector in the third embodiment.

In the detector in the third embodiment, as shown in FIG. 10, an edge of the common electrode 2 extends to the top of the buffer seat 13, following the surface of the sloped seat portion 13A. In locations other than the buffer seat 13, a sloped portion 16 for the electrode formed of an electrically insulating polymeric material extends along the edges of the common electrode 2. The sloped portion 16 has a thickness gradually increasing outwardly of the common electrode 2. The edges of the common electrode 2 extend and mount on the sloped portion 16. Apart from the sloped portion 16 extending along the edges of the common electrode 2 in locations other than the buffer seat 13 and the edge of the common electrode 2 extending to the top of the buffer seat 13, this detector is the same as the detector in the first embodiment. The common features will not described again, but only the different aspect will be described below.

The sloped portion 16 for the electrode is formed, as is the sloped seat portion 13A, of a hard resin material such as epoxy resin, polyurethane resin, acrylic resin or the like, or a soft polymeric material of silicone resin or synthetic rubber base.

Thus, in the detector in the third embodiment, the edges of the common electrode 2 extend over the electrically insulating buffer seat 13 and the sloped portion 16 for the electrode formed of an electrically insulating polymeric material. This eases the electric field concentration on the edges of the common electrode 2, thereby reliably preventing contingent strong currents that would cause a failure of the detector (in particular, destruction of TFTs 6B for storing and reading electric circuit 6), from being produced by the radiation impinging on the edges of the common electrode 2 and the side walls of the buffer seat 13.

This invention is not limited to the above embodiments, but may be modified as follows:

(1) The detectors in the first to third embodiments are the two-dimensional array type. The radiation detectors according to this invention may be the one-dimensional array type having collecting electrodes formed in a one-dimensional matrix array, or the non-array type having a single electrode for outputting radiation detection signals.

(2) The detectors in the first to third embodiments include the analog-to-digital converter 12 besides the gate driver 9, charge-to-voltage converting amplifiers 10 and multiplexer 11. The invention may provide modified detectors having the same constructions as in the first to third embodiments, except that certain or all of the gate driver 9, charge-to-voltage converting amplifiers 10, multiplexer 11 and analog-to-digital converter 12 are omitted.

(3) The detectors in the first to third embodiments have the common electrode 2 partly extending to cover the buffer seat 13. The common electrode 2 may extend not only where the buffer seat is located but also in other locations. For example, the common electrode 2 may extend from the radiation detection effective area to locations all around the circumference the common electrode 2 to an extent flush with the lead wire connection area 2A.

(4) The second and third embodiments may include, as in the modification of the first embodiment, an overcoat formed of a hard resin material and covering at least the buffer seat 13 and sloped seat portion 13A.

This invention may be embodied in other specific forms without departing from the spirit or essential attributes thereof and, accordingly, reference should be made to the appended claims, rather than to the foregoing specification, as indicating the scope of the invention.

What is claimed is:

1. A radiation detector having a radiation sensitive semiconductor for generating electric charges upon incidence of radiation, and a common electrode for bias voltage application formed two-dimensionally on a front surface of the radiation sensitive semiconductor, a lead wire for bias voltage supply being connected to a surface of the common electrode, said detector comprising:

an electrically insulating buffer seat disposed on the front surface of the radiation sensitive semiconductor, in a position outside a radiation detection effective area;

said common electrode for bias voltage application covering at least a portion of the buffer seat, wherein said lead wire for bias voltage supply is connected to a surface portion of the common electrode located on the buffer seat, wherein said buffer seat has a height in a range of 0.2 to 2 mm, and includes a downwardly sloped seat portion formed around a side wall thereof and having a thickness gradually decreasing outwardly away from the buffer seat, said common electrode extending from the radiation detection effective area to a top of the buffer seat, following a surface of the sloped seat portion, and wherein said buffer seat is formed of a hard resin material, and said sloped seat portion is formed of a soft polymeric material of silicone resin or synthetic rubber base.

2. A radiation detector having a radiation sensitive semiconductor for generating electric charges upon incidence of radiation, and a common electrode for bias voltage application formed two-dimensionally on a front surface of the radiation sensitive semiconductor, a lead wire for bias voltage supply being connected to a surface of the common electrode, said detector comprising:

an electrically insulating buffer seat disposed on the front surface of the radiation sensitive semiconductor, in a position outside a radiation detection effective area; and a collimator for preventing the radiation incident on said radiation detection effective area from impinging on edges of said common electrode and said buffer seat;

said common electrode for bias voltage application covering at least a portion of the buffer seat;

wherein said lead wire for bias voltage supply is connected to a surface portion of the common electrode located on the buffer seat.

3. A radiation detector having a radiation sensitive semiconductor for generating electric charges upon incidence of radiation, and a common electrode for bias voltage application formed two-dimensionally on a front surface of the radiation sensitive semiconductor, a lead wire for bias voltage supply being connected to a surface of the common electrode, said detector comprising:

an electrically insulating buffer seat disposed on the front surface of the radiation sensitive semiconductor, in a position outside a radiation detection effective area;

said common electrode for bias voltage application covering at least a portion of the buffer seat, wherein:

said lead wire for bias voltage supply is connected to a surface portion of the common electrode located on the buffer seat, said common electrode has an edge thereof extending over said buffer seat;

said common electrode has, in locations other than said buffer seat, a sloped portion for electrode formed of an electrically insulating polymeric material and extending along edges of said common electrode, said sloped portion having a thickness gradually increasing outwardly of the common electrode; and the edges of the common electrode extend to and mount on said sloped portion.

* * * * *